US012322625B2

(12) United States Patent
Fuller et al.

(10) Patent No.: US 12,322,625 B2
(45) Date of Patent: Jun. 3, 2025

(54) WAFER CONTAINER PURGE PORT ASSEMBLY

(71) Applicant: ENTEGRIS, INC., Billerica, MA (US)

(72) Inventors: Matthew A. Fuller, Colorado Springs, CO (US); Wei Sheng Hsu, Zhubei (TW); Kobold Yang, Hsinchu (TW); Colton J. Harr, Monument, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/125,604

(22) Filed: Mar. 23, 2023

(65) Prior Publication Data

US 2023/0307275 A1    Sep. 28, 2023

Related U.S. Application Data

(60) Provisional application No. 63/323,758, filed on Mar. 25, 2022.

(51) Int. Cl.
*H01L 21/673*    (2006.01)

(52) U.S. Cl.
CPC .. *H01L 21/67393* (2013.01); *H01L 21/67376* (2013.01)

(58) Field of Classification Search
CPC ........ B65D 81/05; B65D 81/26; B65D 85/30; B65D 2581/05; B65D 2585/30; H01L 21/6732; H01L 21/67376; H01L 21/67393
USPC .................................................. 206/710–711
See application file for complete search history.

(56) References Cited

U.S. PATENT DOCUMENTS

| 10,032,660 | B2 | 7/2018 | Burns et al. |
| 10,672,637 | B2 | 6/2020 | Glavan et al. |
| 11,610,795 | B2* | 3/2023 | Smith ............... H01L 21/67393 |
| 11,646,214 | B2* | 5/2023 | Ogawa ............. H01L 21/67383 |
| | | | 206/710 |
| 2016/0276190 | A1 | 9/2016 | Smith et al. |
| 2018/0247849 | A1 | 8/2018 | Glavan et al. |
| 2020/0343117 | A1 | 10/2020 | Eggum et al. |
| 2020/0365435 | A1 | 11/2020 | Fuller et al. |
| 2022/0208582 | A1* | 6/2022 | Fuller ............... H01L 21/67775 |

FOREIGN PATENT DOCUMENTS

KR        20160144511 A    12/2016

* cited by examiner

*Primary Examiner* — Bryon P Gehman

(57) ABSTRACT

A purge port assembly for a wafer container includes a purge module configured to allow inlet flow of purge gas and a transition portion disposed over an intermediate outlet of the purge module. The transition portion includes a receiver configured to receive the purge gas discharged from the purge module, an outlet connector configured to attach with a diffuser, and an intermediate conduit. The intermediate conduit connects the receiver to the outlet connector and extends from the receiver at an acute angle relative to an axis of the inlet opening of the receiver. The intermediate conduit has a length that spaces apart the outlet connector from the receiver. A wafer container includes a shell and a purge port assembly. The shell includes an interior space. The purge port assembly extends through an opening in the shell into the interior space.

17 Claims, 9 Drawing Sheets

Fig. 2

WAFER CONTAINER PURGE PORT ASSEMBLY

FIELD

This disclosure relates to a purge ports in a wafer container. More specifically, this disclosure relates to purge port assemblies in front opening unified pods.

BACKGROUND

A semiconductor device can be manufactured from a wafer substrate. The wafer substrate, or simply wafer, undergoes a series of fabrication steps. For example, fabrication steps can include, but are not limited to, material layer deposition, doping, etching, or chemically or physically reacting material(s) of the substrate. One or more wafers can be stored and transported in a wafer container, such as a front opening unified pod ("FOUP"), before, during, or after fabrication. In some fabrication steps, the wafers may be treated while still inside the wafer container. A wafer container can include one or more purge ports for supplying purge gas into the interior of the wafer container. For example, purge gas may be gas supplied to keep the interior of a FOUP at a positive pressure (e.g., above the pressure of the exterior environment, above atmospheric) while the FOUP is open.

SUMMARY

In an embodiment, a purge port assembly is for a wafer container. The purge port assembly includes a purge module and a transition portion disposed over an intermediate outlet of the purge module. The purge module is configured to allow inlet flow of purge gas. The transition portion is disposed over an intermediate outlet of the purge module. The transition portion includes a receiver, an outlet connector, and an intermediate conduit. The receiver has an inlet opening configured to receive the purge gas discharged from the purge module. The outlet connector is configured to attach with a diffuser. The intermediate conduit connects the receiver to the outlet connector. The intermediate conduit extends from the receiver at an acute angle relative to an axis of the inlet opening of the receiver. The intermediate conduit has a length that spaces apart the outlet connector from the receiver.

In an embodiment, a wafer container includes a shell and a purge port assembly. The shell includes an interior space. The purge port assembly extends through an opening in the shell into the interior space. The purge port assembly includes a purge module and a transition portion. The module is disposed in the opening in the shell is configured to allow inlet flow of purge gas. the transition portion includes a receiver, an outlet connector, and an intermediate conduit. The receiver has an inlet opening configured to receive the purge gas discharged from the purge module. The outlet connector is configured to attach with a diffuser. The intermediate conduit connects the receiver to the outlet connector. The intermediate conduit extends from the receiver at an acute angle relative to an axis of the inlet opening of the receiver. The intermediate conduit has a length that spaces apart the outlet connector from the receiver.

In an embodiment, a purge port assembly for a wafer container includes a purge module configured to allow inlet flow of purge gas and a transition portion disposed over an intermediate outlet of the purge module. The transition portion includes a receiver having an inlet opening configured to receive the purge gas discharged from the purge module, an outlet connector configured to attach with a diffuser, and an intermediate conduit connecting the receiver to the outlet connector. The intermediate conduit has a tubular shape extending from the receiver to the outlet connector and a length that spaces apart the outlet connector from the receiver.

In an embodiment, a minimum inner cross-sectional area of the intermediate conduit is at least 13 $mm^2$.

In an embodiment, a pressure drop across the intermediate passage is less than 20 kPa at a purge gas flowrate of 100 SLPM.

In an embodiment, the intermediate conduit extends from the receiver at an acute angle relative to an axis of the inlet opening of the receiver. In an embodiment, the acute angle is 15-35 degrees.

In an embodiment, the intermediate conduit includes a curve. In an embodiment, the curve is continuous along a length of the intermediate conduit.

In an embodiment, the intermediate conduit extends such that the outlet connector is spaced entirely apart from the receiver when the purge port assembly is viewed in plan view.

In an embodiment, a portion of intermediate conduit projecting from an upper surface of the receiver has a width that is less than half of a diameter of the body of receiver.

In an embodiment, a ratio of an area of the inlet opening of the receiver to a minimum cross-sectional area of the intermediate conduit is equal to or greater than 23:1

In an embodiment, a portion of the intermediate conduit projecting above an upper surface of the receiver is disposed entirely on one side of a center line of the receiver.

In an embodiment, the transition portion is formed integrally with the outlet connector.

In an embodiment, the purge module and the transition portion are configured to be disposed in an opening in a shell of the wafer container, the opening extending through a bottom side of the shell of the wafer container and the purge port assembly configured to block the opening in the shell. In an embodiment, the transition portion is configured to extend from the opening into an interior space of the wafer container.

In an embodiment, a wafer container includes a shell including an interior space, a purge port assembly extending through an opening in the shell into the interior space, the purge port assembly including a purge module disposed in the opening in the shell, the purge module including a check valve configured to allow purge gas and a transition portion disposed over the purge module in the opening in the shell. The transition portion includes a receiver with an inlet opening configured to receive the purge gas discharged from the purge module, an outlet connector configured to attach with a diffuser, and an intermediate conduit connecting the receiver to the outlet connector. The intermediate conduit has a tubular shape extending from the receiver to the outlet connector and a length that spaces apart the outlet connector from the receiver.

In an embodiment, the transition portion extends from the opening in the shell into the interior space of the shell, the receiver of the transition portion is disposed in the opening in the shell, the outlet connector of the transition portion is disposed in the interior space of the shell, and the intermediate conduit extends from the opening in the shell into the interior space of the shell.

In an embodiment, the intermediate conduit extends at an acute angle relative to an axis of the inlet opening of the receiver. In an embodiment, the acute angle is in a range from 15-35 degrees.

In an embodiment, the wafer container is a front opening unified pod, the shell including a front opening and a door configured to be disposed in the front opening.

In an embodiment, the wafer container further includes the diffuser, the diffuser having a column shape and including an end fittingly connected to the outlet connector.

DRAWINGS

Like numbers represent like features.

DETAILED DESCRIPTION

This disclosure relates to wafer containers and a purge port assembly in a wafer container.

As used herein, a portion of a channel is defined as "curved" when a center line of the channel, at a center of the cross-sectional area and perpendicular to the plane of the cross-section in which said cross-sectional area is taken, follows an arc having a radius during said portion of the channel. The channel can be defined as a "curved" channel when it includes one or more portions that are curved as defined herein, and the one or more curved portions comprise at least a quarter of the length of the channel.

Figure 6:
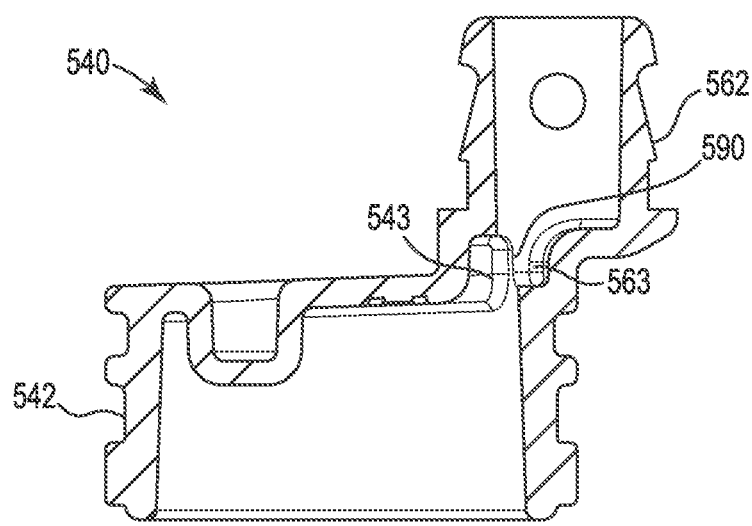
FIG. 6 is a cross-sectional view of a conventional transition portion for a purge port assembly.

FIG. 6 is a cross-sectional view of an example of a conventional transition portion 540 for a purge port assembly. The transition portion 540 includes a receiver 542 and an outlet connector 562. The receiver 540 and the outlet connector 562 are formed in the transition portion 540 to be in direct contact with each other. For example, the upper end 542 of the receiver 540 and the bottom end 563 of the outlet connector 562 directly contact each other. In particular, the outlet opening in the upper end 542 of the receiver 540 and the inlet opening in the bottom end 563 of the outlet connector 562 are the same opening 590. For example, the opening 590 is a window formed at the intersection of the receiver 540 and the outlet connector 562. The receiver 540 and the outlet connector 562 are formed in the conventional transition portion 540 such they are not spaced apart from each other.

Figure 1A:
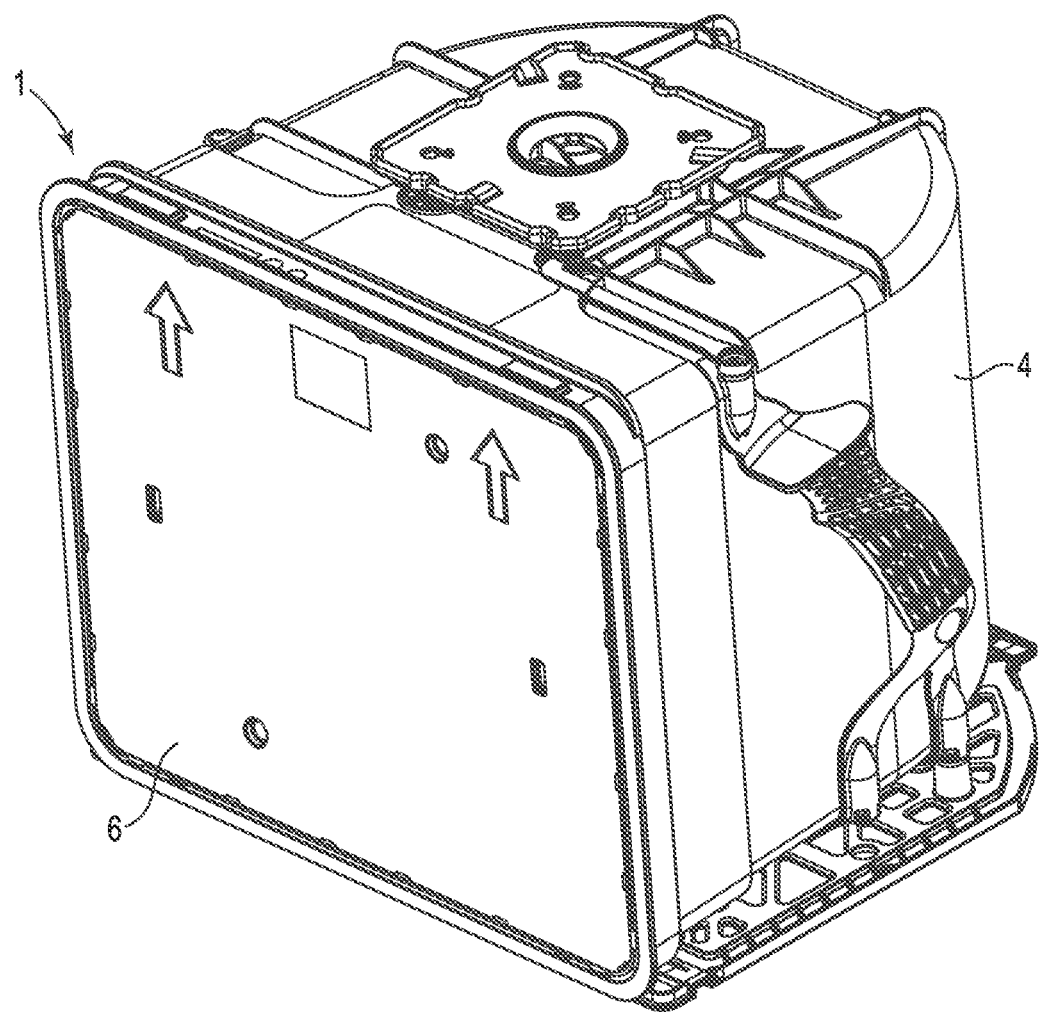
FIG. 1A is a front perspective view of an embodiment of a wafer container.
Figure 1B:
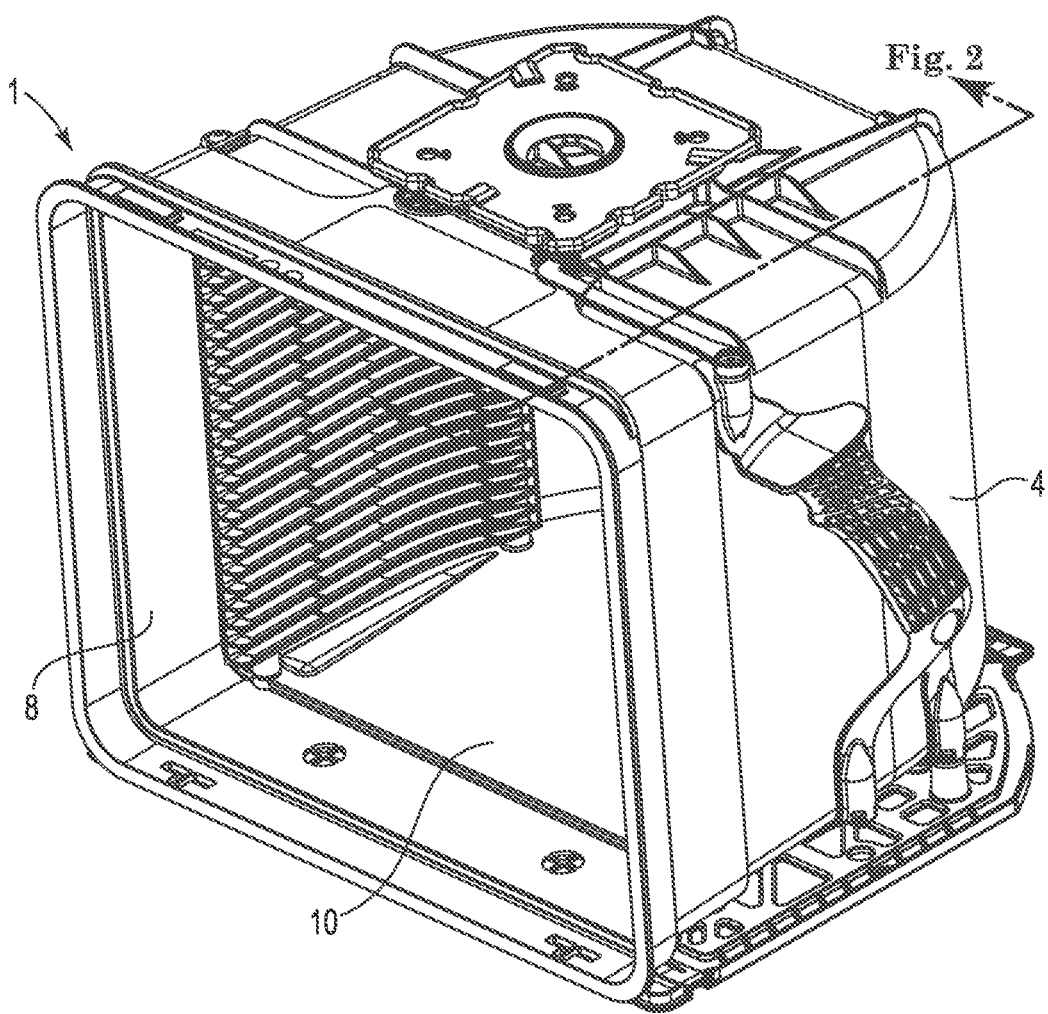
FIG. 1B is a front perspective view of the wafer container in FIG. 1A when open, in an embodiment.

FIGS. 1A and 1B are front perspective views of an embodiment of a wafer container 1. In the illustrated embodiment, the wafer container 1 is a front opening unified pod ("FOUP"). The container 1 includes a shell 4 and a door 6. The shell 4 includes an opening 8 (e.g., a front opening). The door 6 couples to the shell 4 covering the front opening 8 and forms an interior space 10. This interior space 10 can be also referred to as the enclosed space of the wafer container 1. For example, the door 6 may be coupled to shell 4 by being mechanically latched or suction-fitted within a corresponding opening of shell 4. For example, the door 6 in an embodiment may be coupled to shell 4 (e.g., via a hinge) on one of the top, the bottom, or either side of the opening 8 of shell 4. The door 6 covers the opening 8 and the container 1 can be accessed by moving (e.g., opening, removing) the door 6. FIG. 1A shows the wafer container 1 when closed (e.g., with the door 6 covering the opening 8). FIG. 1B shows the wafer container 1 when open (e.g., with the door 6 removed/uncoupled).

Figure 2:
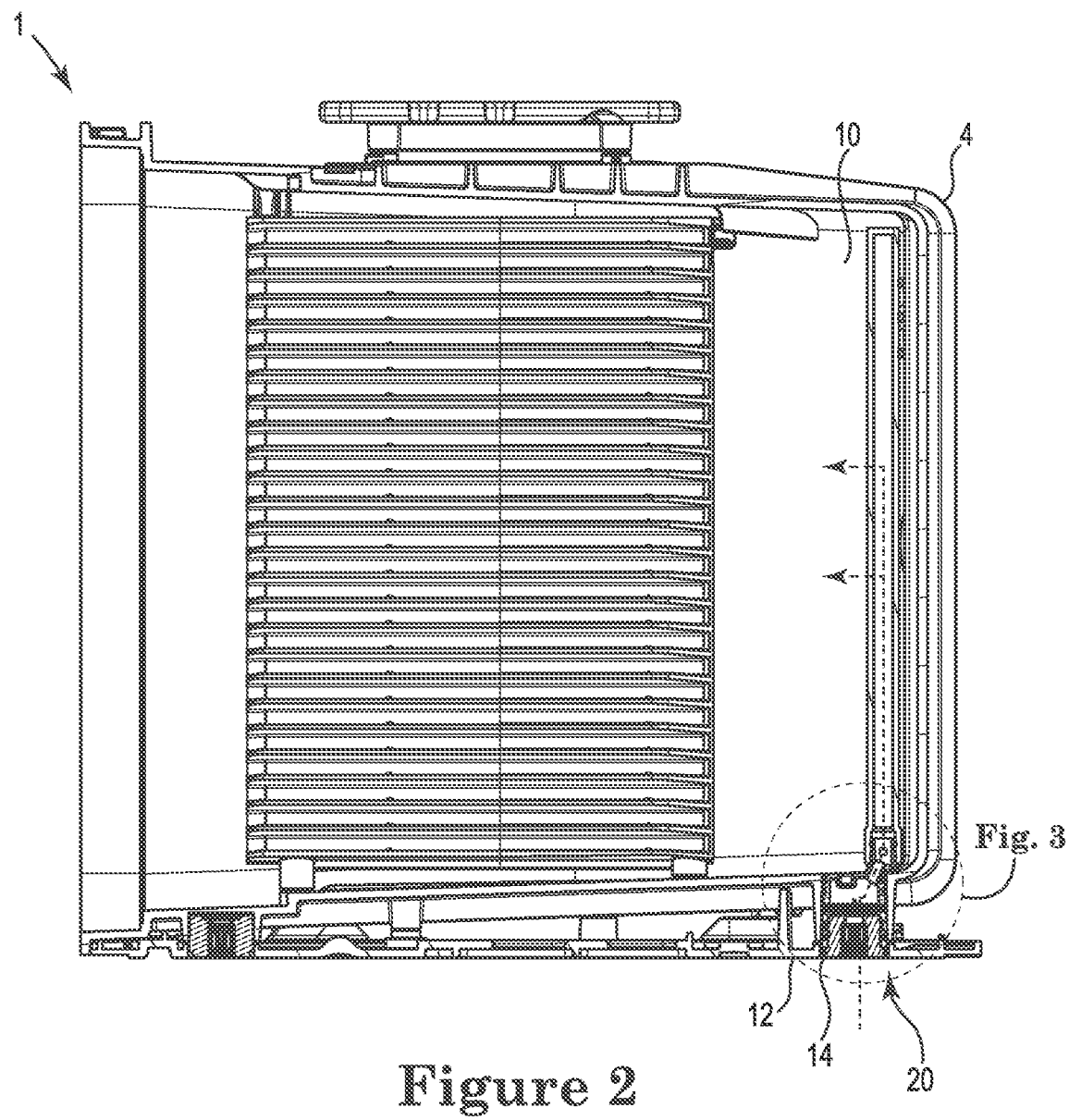
FIG. 2 is a cross-sectional view of the wafer container in FIG. 1B, in an embodiment.

FIG. 2 is a partial cross section of the wafer container 1 as indicated in FIG. 1B, according to an embodiment. The wafer container 1 includes a purge port assembly 20 that forms a purge port in the wafer container 1 for supplying purge gas into the interior space 10. The purge port is formed in the bottom 12 of the shell 4. A purge port assembly 20 extends through the shell 4 into the wafer container 1. The container 1 can include one or more of the purge ports. For example, the container 1 in FIG. 2 includes four purge ports (e.g., two purge ports are obscured in FIG. 2). In another embodiment, the container 1 may include a different number of purge ports (e.g., one, two, three, five, etc.). As shown in FIG. 2, the purge port assembly 20 can be used for a rear purge port of the container 1 that is closer to the rear than to the front of the shell 4 (e.g., closer to rear than to the front opening 8).

The container 1 is configured to hold one or more semiconductor substrates (not shown) within its interior space 10. In an embodiment, the container 1 is configured to hold a plurality of semiconductor substrates. The purge port assembly 20 is for supplying purge gas into the interior space 10 of the container 1. For example, purge gas suppled through a purge port can include, but is not limited to, generally inert gases (e.g., nitrogen), filtered air (e.g., clean dry air), etc. FIG. 2 includes dashed arrows to indicate the general flow of the purge gas through the purge port assembly 20.

Figure 3:
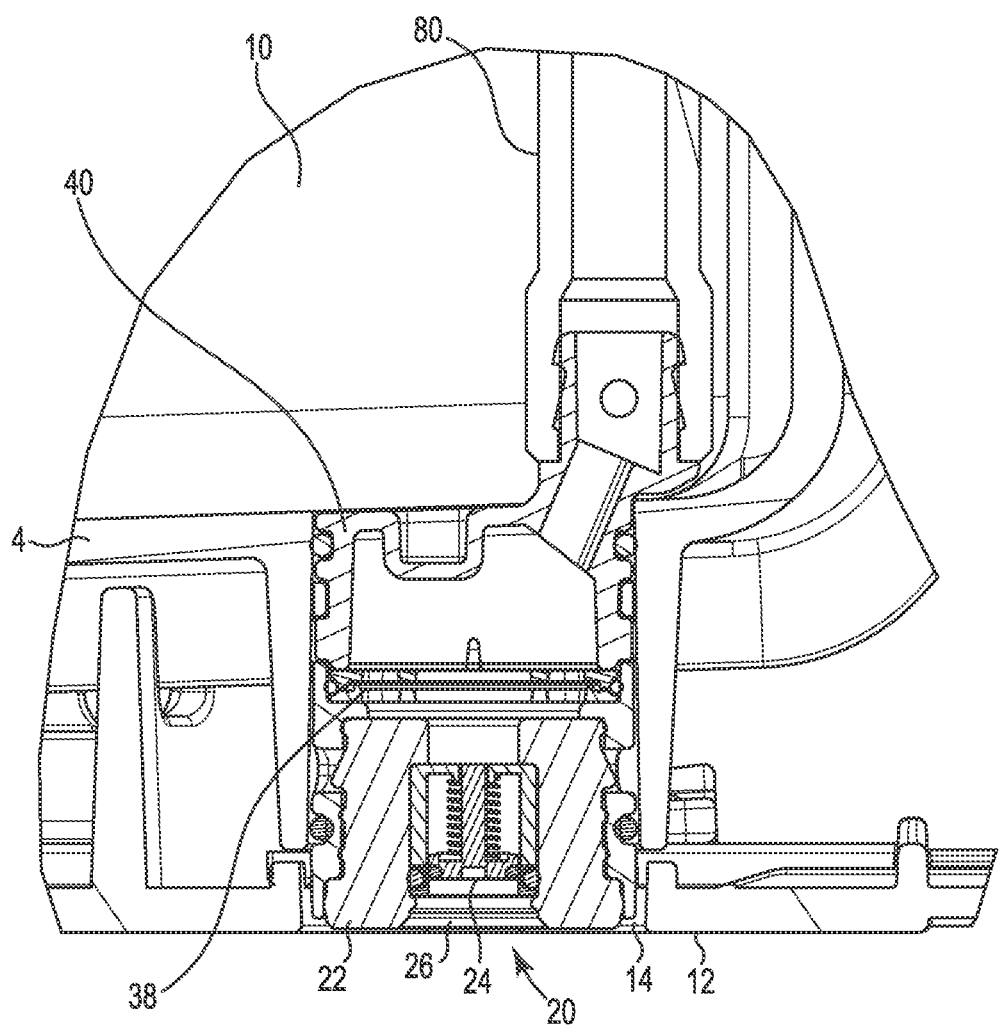
FIG. 3 is an enlarged view of a purge port assembly of the wafer container in FIG. 2.

FIG. 3 is a partial enlarged view of the wafer container 1 in FIG. 2. In particular, FIG. 3 shows an enlarged view of the purge port assembly 20 as indicated in FIG. 2. As shown in FIG. 3, the purge port assembly 20 extends through the bottom 12 of the shell 4. The shell 4 includes an opening 14 in its bottom 12 that extends through the bottom 12 to the interior space 10. The purge port assembly is disposed in the opening 14 in the shell 4. The purge port assembly 20 is configured to block the opening 14 such that fluid can only pass through the opening 14 into the interior space 10 by flowing through the purge port assembly 20.

The purge port assembly 20 includes a purge module 22, a transition portion 40, and a diffuser 80. The purge module 22 is configured to prevent ambient air and allow an inlet flow of purge gas into the purge port assembly 20. For example, a purge nozzle (not shown) is configured to supply purge gas to purge module 22. The purge module 22 can include a check valve 24 that opens to allow purge gas to flow into purge port assembly 20 and through the purge module 22, and in some embodiments a grommet configured to interface with the purge nozzle. The check valve 24 prevents ambient air from flowing into the purge port assembly 20. In an embodiment, the check valve 24 may be configured to actuate open by the pressure of the purge gas (e.g., higher than ambient pressure). In an embodiment, the check valve 24 may be configured to actuate open by the purge nozzle physically contacting and pushing on the check valve 24.

Figure 4:
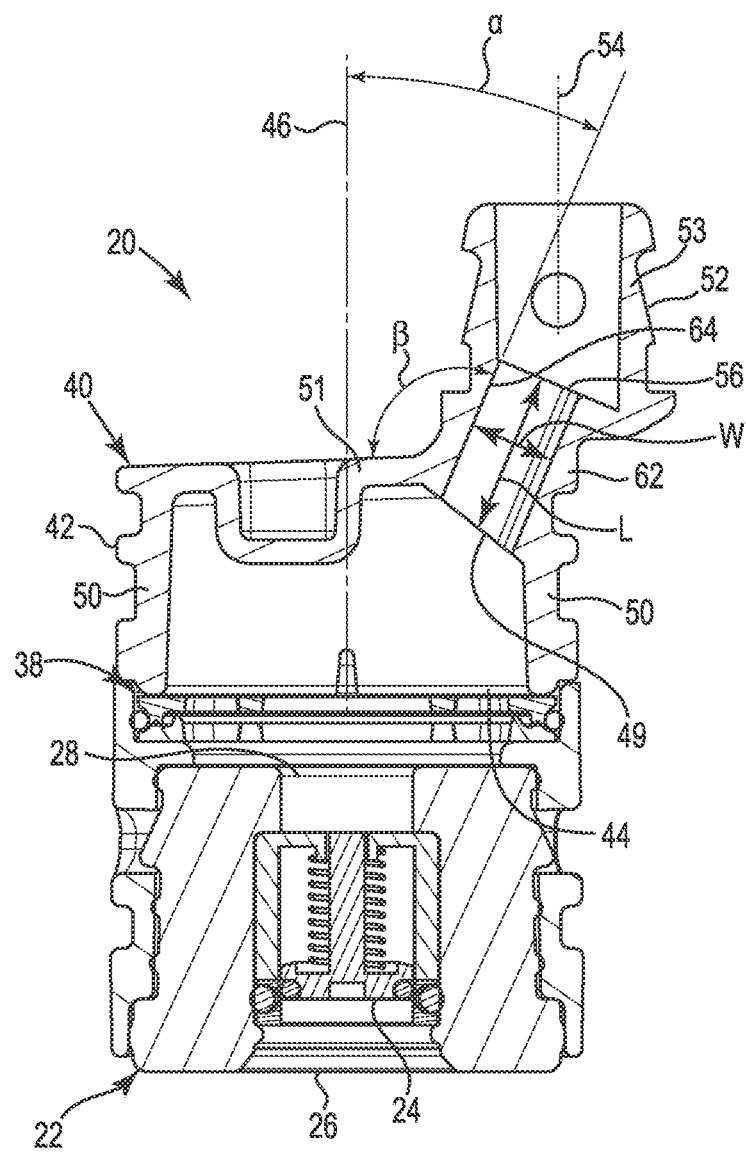
FIG. 4 is a cross-sectional view of an embodiment of a purge port assembly.

FIG. 4 is a cross-sectional view of the purge port assembly 20 without the diffuser 80. The purge gas flows through the purge port assembly 20 by entering through an external inlet 26 in the purge module 22 and exits from the diffuser 80. The purge gas flows from the purge module 22 to the transition portion 40, and from the transition portion 40 to the diffuser 80. The purge port assembly 20 can also include a filter 38 disposed between the purge module 22 and the transition portion 40. The filter 38 is configured to remove for example, solid particulates, from the purge gas as it flows through the purge port assembly 20.

The purge module 22 is disposed in the opening 14 in the shell 4. The purge module 22 includes the external inlet 26 and a first intermediate outlet 28. The purge gas enters the purge module 22 via the external inlet 26, flows through the purge module 22, and then exits the purge module 22 via the (first) intermediate outlet 28. The purge gas discharged from the purge module 22 then flows into the transition portion 40. In an embodiment, as shown in FIG. 3, the purge gas can through the filter 38 as it flows from the purge module 22 to transition portion 40.

As shown in FIG. 3, the transition portion 40 is disposed over the outlet (e.g., intermediate outlet 28) of the purge module 22. The transition portion 40 includes a receiver 42, an outlet connector 52, and an intermediate conduit 62. The transition portion 40 is disposed in the opening 14 in the shell 4. The transition portion 40 is stacked on the purge module 22 within the opening 14 in the shell 4. For example, the transition portion 40 is disposed over the purge module 22 within the opening 14. The intermediate conduit 62 extends from the opening 14 in the shell 4 into the interior space 10. The outlet connector 52 is disposed within the shell 4 (e.g., in the interior space 10 of the shell 4).

As shown in FIG. 4, the transition portion 40 is formed as a single integral part. For example, the transition portion 40 in the illustrated embodiment is a single integral part formed by polymer injection molding. The receiver 42 includes an inlet opening 44 configured to receive the purge gas discharged from the purge module 22. The inlet opening 44 is disposed over the outlet 28 of the purge module 22 such that the purge gas discharged from the purge module 22 flows into the receiver 42 of the transition portion 40 via the inlet opening 44.

The outlet connector 52 is configured to attach with the diffuser 80 (shown in FIGS. 2 and 3). The purge gas flows through the diffuser into the interior space 10 of the wafer container 1. An end of the diffuser 80 can be fittedly connected onto the outlet connector 52. In the illustrated embodiment, the outlet connector 52 has barbs configured to connect and hold the diffuser 80 onto the outlet connector 52. In another embodiment, the outlet connector 52 may use a different structure and/or configuration for connecting the outlet connector 52 and the diffuser 80. The purge port assembly 20 discharges the purge gas into the interior space 10 from the diffuser 80. In the illustrated embodiment, the diffuser 80 has a column shape (e.g., as shown in FIG. 2). However, it should be appreciated that the diffuser 80 may have a different shape (disk shape, cap shape, etc.) in other embodiments.

Figure 5:
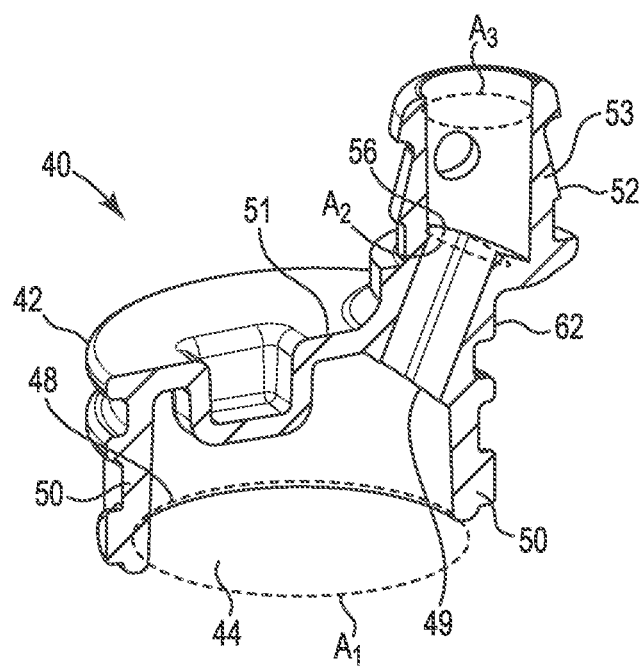
FIG. 5 is a perspective view of a cross-section of a transition portion of the purge port assembly in FIG. 4.

FIG. 5 shows a perspective view of the transition portion 40. The intermediate conduit 62 connects the receiver 42 to the outlet connector 52. The purge gas flows from receiver 42 to the outlet connector through the intermediate conduit 62. The intermediate conduit 62 has a tubular shape. In the illustrated embodiment, the tubular shape of the intermediate conduit 62 is a circular (e.g., the cross-section of the tubular shape is circular). It should be appreciated that the tubular shape of the intermediate conduit 62 can be a different shape. In another embodiment, the tubular shape of the intermediate conduit 62 may be oval, rectangular, hexangular, etc.

The intermediate conduit 62 has a minimum inner cross-sectional area $A_2$ that is at or greater than 13 mm$^2$. The purge gas passes through the minimum inner cross-sectional area $A_2$ of the intermediate conduit 62 (e.g., cross-sectional area is of the internal open cross-section of the intermediate conduit 62). In an embodiment, the minimum inner cross-sectional area $A_2$ of the intermediate conduit 62 is at or greater than 15 mm$^2$. In an embodiment, the minimum inner cross-sectional area $A_2$ of the intermediate conduit 62 is at or greater than 18 mm$^2$. As shown in FIG. 5, the minimum inner cross-sectional area $A_3$ of the outlet connector 52 is at least equal to the minimum cross-sectional area $A_2$ of the intermediate conduit 62. For example, "inner cross-sectional area" refers to the cross-sectional area of the open portion through which the purge gas flows (e.g., cross-sectional area being along a plane perpendicular to the flow direction of the purge gas).

As shown in FIG. 4, the intermediate conduit 62 extends from the receiver 42 at an acute angle α relative to the axis 46 of the inlet opening 44 of the receiver 42. The axis 42 of the receiver 42 is offset from the axis 54 of the outlet connector 52. At least part of the outlet connector 52 does not vertically overlap with the receiver 42 (e.g., the right outer wall 53 of the outlet connector 52 does not vertically overlap with the receiver 42). For example, vertical may be a direction perpendicular to the bottom of the purge module 22 (e.g., perpendicular to the bottom 12 of the shell 4). In an embodiment, the acute angle α at which the intermediate conduit 62 extends from the receiver 42 is 15-35 degrees relative to the axis 46 of the inlet opening 44 of the receiver 42. In an embodiment, the acute angle α at which intermediate conduit 62 extends from the receiver 42 is 20-30 degrees. For example, an axis of an opening is the axis that extends through the opening (e.g., in the flow direction of the purge gas into the opening, the vertical axis).

The intermediate conduit 62 has a length L that spaces apart the outlet connector 52 from the receiver 42. The intermediate conduit 62 has a length L that is larger than an inner width W of the conduit 62. The inner width W is the width measured between the inner sides of the conduit (e.g., is the minimum inner diameter for a circular tubular shaped inner conduit, etc.). For example, the inner width W extends in direction perpendicular to the length L of the intermediate conduit. In an embodiment, the inner width W is the minimum inner width of the intermediate conduit 62. In an embodiment, the inner width W is the maximum inner width of the intermediate conduit 62.

The pressure drop across the intermediate conduit is less than 20 kPa at a purge gas flow rate of 100 standard liters per minute (SLPM). For example, the pressure drop may measure as the drop in pressure of the purge gas in the receiver 42 to the pressure of the purge gas in the outlet connector 52. The purge gas used for measuring the pressure drop can be air.

FIG. 5 is a perspective view of the cross-section of the transition portion 40 in FIG. 4. The receiver 42 of the transition portion 40 includes a first intermediate inlet 48, a second intermediate outlet 49, side walls 50, and an end wall 54. The first intermediate inlet 48 forms the inlet opening 44 of the receiver 42. Purge gas enters the receiver 42 through the (first) intermediate inlet 48 and exits the receiver 42 through the (second) intermediate outlet 49. The inlet opening 44 and the (first) intermediate inlet 48 are formed by the one or more side walls 50. For example, the left and right side walls 50 of the receiver can be formed by a continuous wall having a tubular shape (e.g., a circular wall). The end wall 51 and the inlet opening 44 are disposed at opposite ends of the receiver 42 (e.g., at the top and the bottom of the receiver 42). One of the side walls 50 (e.g., the left side wall 50 in FIG. 5) extends from the end wall 51. The end wall 51 can connect one or more of side walls 50 to the intermediate conduit 62 (e.g., the left side wall 50 in FIG. 5). The second intermediate outlet 49 is formed by an end of one of the side walls 50 (e.g., the right side wall 50 in FIG. 5) and an end of the end wall 51. The second intermediate outlet 49 faces at an angle (e.g., is not facing vertically downward, not facing parallel to the axis 54, not facing parallel to the axis 46). The second intermediate outlet 49 can extend between the end of one of the side walls 50 (e.g., the right side wall in FIG. 4) and the end of the end wall 51 at an angle relative to said side wall 50 and at an angle relative to the end wall 51 (e.g., not parallel to the end wall 51, not parallel to the right side wall in FIG. 4).

The outlet connector 52 includes a second intermediate inlet 56. The purge gas flows into the outlet connector 52 from the intermediate conduit 62 through the (second) intermediate inlet 56. The intermediate conduit 62 extends from the (second) intermediate outlet 49 of the receiver 42 to the (second) intermediate inlet 56 of the outlet connector 52. The intermediate conduit 62 fluidly connecting the outlet 49 of the receiver 42 to the inlet 56 of the outlet connector 52. The (second) intermediate outlet 49 of the receiver 42 is spaced apart from the (second) intermediate inlet 56 of the outlet connector 52 by the length L of the outlet connector 52. The intermediate inlet 56 of the outlet connector 52 extends at an angle (e.g., is not facing vertically upward, not facing parallel to the axis 54, not facing parallel to the axis 46). For example, the discharge from the intermediate conduit 62 through intermediate inlet 56 into the outlet connector 52 at least partially overlaps with the sidewall 53 of the outlet connector 52.

The acute angle α may be the angle of an inner side 64 of the intermediate conduit 62 that extends from the end wall 51 of the receiver. In an embodiment, the angle β between the end wall 51 of the receiver 42 and the inner side 64 of the intermediate conduit 62 is at or about 105-125 degrees. In an embodiment, the angle β between the end wall 51 of the receiver 42 and the inner side 64 of the intermediate conduit 62 is at or about 110-120 degrees. In an embodiment the angle of the inner side 64 of the intermediate conduit 62 relative to the bottom of the purge module 22 is at or about 105-125 degrees. In an embodiment the angle of the inner side 64 of the intermediate conduit 62 relative to the bottom of the purge module 22 is at or about 110-120 degrees.

In an embodiment, a ratio of the area $A_1$ of the inlet opening 44 of the receiver 42 to the minimum inner cross-sectional area $A_2$ of the intermediate conduit 62 (area $A_1$: minimum inner cross-sectional area $A_2$) is equal to or greater than 23:1. In an embodiment, a ratio of the area $A_1$ of the inlet opening 44 of the receiver 42 to the minimum inner cross-sectional area $A_2$ of the intermediate conduit 62 (area $A_1$: minimum inner cross-sectional area $A_2$) is equal to or greater than 19.5:1.

In an embodiment, a ratio of the minimum inner cross-sectional area $A_3$ of the inlet connector 52 to the minimum cross-sectional area $A_2$ of the intermediate conduit 62 (minimum inner cross-sectional area $A_3$: minimum cross-sectional area $A_2$) is equal to or less than 2.5:1. In an embodiment, the ratio of the minimum inner cross-sectional area $A_3$ of the inlet connector 52 to the minimum cross-sectional area $A_2$ of the intermediate conduit 62 (minimum inner cross-sectional area $A_3$: minimum cross-sectional area $A_2$) is equal to or less than 2.5:1. In an embodiment, the ratio of the minimum inner cross-sectional area $A_3$ of the inlet connector 52 to the minimum cross-sectional area $A_2$ of the intermediate conduit 62 (minimum inner cross-sectional area $A_3$: minimum cross-sectional area $A_2$) is equal to or less than 1.5:1. For example, in the illustrated embodiment, the ratio of the minimum inner cross-sectional area $A_3$ of the inlet connector 52 to the minimum cross-sectional area $A_2$ of the intermediate conduit 62 is 1.5:1.

Figure 7A:
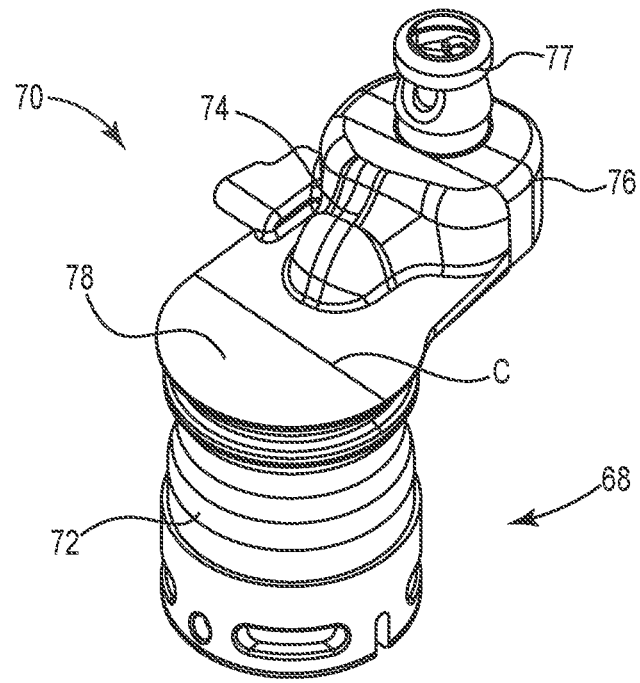
FIG. 7A is a perspective view of a purge port assembly according to an embodiment.

FIG. 7A is a perspective view of a purge port assembly according to an embodiment. Purge port assembly 68 includes transition bracket 70. Transition bracket 70 includes receiver 72, intermediate conduit 74, and outlet connector 76. The receiver 72 and intermediate conduit 74 are configured to reduce a profile of the portion of intermediate conduit 74 extending above an upper surface 78 of the receiver 72. The intermediate conduit 74 can be configured such that the portion of intermediate conduit 74 projecting from upper surface 78 has a width that is less than half of a diameter of the body of receiver 72 outside of an interface with outlet connector 76. The intermediate conduit 74 can be positioned such that the entire portion of the intermediate conduit 74 projecting above upper surface 78 is disposed on one side of a center line C of the receiver 72. The reduced profile of intermediate conduit 74 can reduce or eliminate interference between the transition bracket 70 and a wafer or other substrate being stored within the container including purge port assembly 68 and/or interference with automation being used to handle such a wafer or other substrate. The intermediate conduit 74 can be configured to extend such that the outlet connector 76 is completely offset from the receiver 72. In such an embodiment, when the transition bracket 70 is viewed in plan view, the outlet connector 76 is entirely spaced apart from and does not overlap with receiver 72. The outlet connector 76 can be a separate piece, for example a cap, attached to the intermediate conduit 74 by any suitable connection. A non-limiting example of such a suitable connection is a weld. In an embodiment, a standard cap for transition brackets can be combined with the receiver 72 and intermediate conduit 74 of an embodiment. In an embodiment, the intermediate conduit 74 can include a portion that is configured to receive the outlet connector 76. For example, as shown in FIG. 7A, a portion of the intermediate conduit 74 can flare out to a suitable size for interface with the outlet connector 76. In another embodiment, the outlet connector 76 can be formed integrally with the receiver 72 and intermediate conduit 74. The outlet connector 76 can include features allowing any suitable attachment of a diffuser (not shown) to the outlet connector 76, for example including barbs 77 to allow mechanical attachment of the diffuser at outlet connector 76.

Figure 7B:
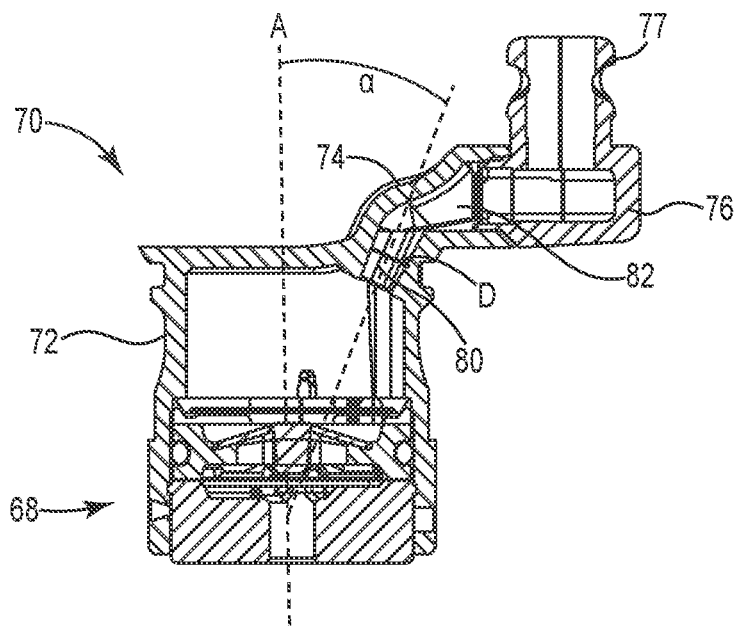
FIG. 7B is a sectional view of the purge port assembly of FIG. 7A

FIG. 7B is a sectional view of the purge port assembly of FIG. 7A. Intermediate conduit 74 is shaped to define channel 80 and outlet connector transition 82. Channel 80 can extend straight through the intermediate conduit 74. Channel 80 can be at an acute angle α with respect to a central axis A of the receiver 72. In an embodiment, the acute angle α is in a range from 15-35 degrees. In an embodiment, channel 80 can be tubular in shape. In an embodiment, the channel 80 can have a circular cross-sectional shape. In an embodiment, the channel 80 can have a non-circular cross-sectional shape, for example an elliptical shape. In an embodiment, channel 80 can have a consistent internal diameter D. Channel 80 can be configured allow purge from receiver 72 to pass through the intermediate conduit 74 to outlet connector 76 while having an acceptable pressure differential, even with the reduced width and lowered profile of the exterior of intermediate conduit 74. Channel 80 can feed into outlet connector transition 82 also formed in the intermediate conduit 74. The outlet connector transition 82 can be a space configured to receive flow from channel 80 and transition to a size such that the outlet connector 76 can interface with the intermediate conduit 74. In an embodiment, the intermediate conduit 74 has a cross-sectional area at the outlet connector 76 corresponding to the cross-section of a connector portion of the barb cap.

Figure 8A:
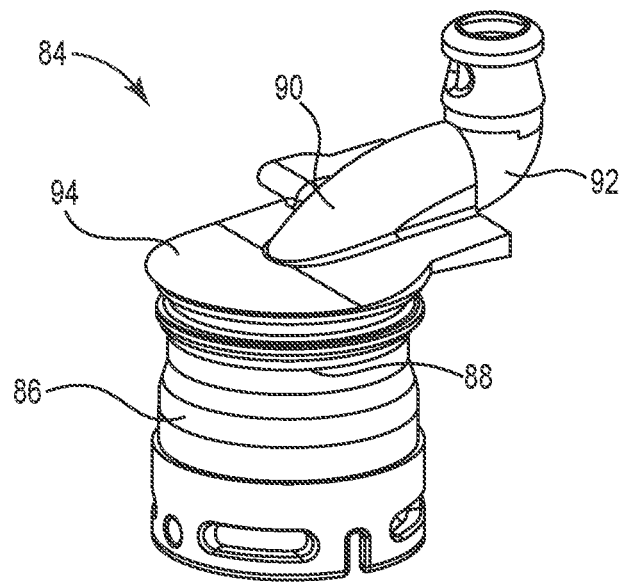
FIG. 8A is a perspective view of a purge port assembly according to an embodiment.

FIG. 8A is a perspective view of a purge port assembly according to an embodiment. Purge port assembly 84 includes transition bracket 86. Transition bracket 86 includes receiver 88, intermediate conduit 90, and outlet connector 92. The receiver 88 and intermediate conduit 90 are configured to reduce a profile of the portion of intermediate conduit 90 extending above an upper surface 94 of the receiver 88. The intermediate conduit 90 can be configured such that the portion of intermediate conduit 90 projecting from upper surface 94 has a width that is less than half of a diameter of the body of receiver 88. The reduced profile of intermediate conduit 90 can reduce or eliminate interference between the transition bracket 86 and a wafer or other substrate being stored within the container including purge port assembly 84 and/or interference with automation being used to handle such a wafer or other substrate. The intermediate conduit 90 can be configured to extend such that the outlet connector 92 is completely offset from the receiver 88. In such an embodiment, when the transition bracket 86 is viewed in plan view, the outlet connector 92 is entirely spaced apart from receiver 88 and does not overlap with receiver 88. The outlet connector 92 can be a separate piece, for example a cap, attached to the intermediate conduit 90 by any suitable connection. A non-limiting example of such a suitable connection is a weld. In the embodiment shown in FIG. 8A, the outlet connector can be a cap configured to correspond to the size of the intermediate conduit 90, for example by having the same width. In an embodiment, the outlet connector 92 can be formed integrally with intermediate conduit 90. The outlet connector 92 can include features allowing any suitable attachment of a diffuser (not shown) to the outlet connector 92, for example including barbs 93 to allow mechanical attachment of the diffuser at outlet connector 92.

Figure 8B:
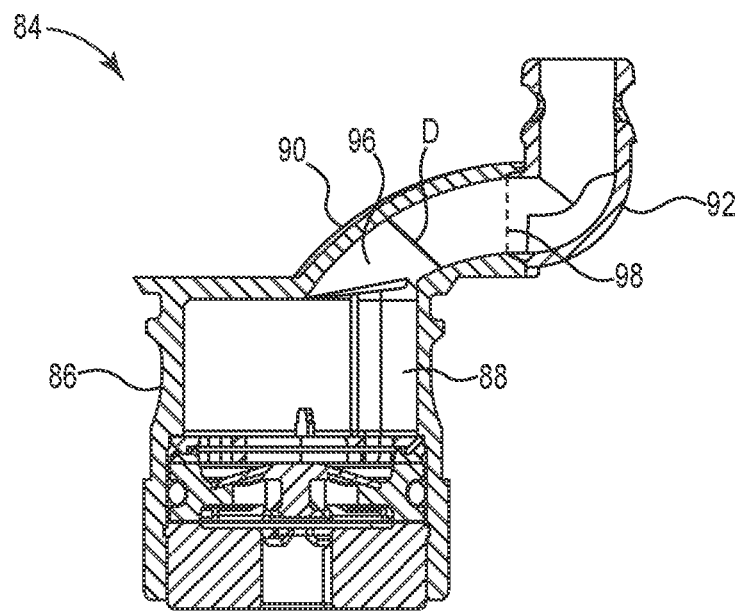
FIG. 8B is a sectional view of the purge port assembly of FIG. 8A.

FIG. 8B is a sectional view of the purge port assembly of FIG. 8A. Intermediate conduit 90 is shaped to define channel 96. Channel 96 can extend the entirety of the distance from the receiver 88 to outlet connector 92. Channel 96 can be curved as it extends from receiver 88 to the outlet connector 92. In an embodiment, channel 96 can be tubular in shape. In an embodiment, the channel 96 can have a circular cross-sectional shape. In an embodiment, the channel 96 can have a non-circular cross-sectional shape, for example an elliptical shape. In an embodiment, channel 96 can have a consistent internal diameter D. In an embodiment, channel 96 can increase in diameter D when moving from the receiver 88 towards the outlet connector 92. In an embodiment, the intermediate conduit 90 is joined to outlet connector 92 at weld 98. In another embodiment, intermediate conduit 90 and outlet connector 92 are formed integrally with one another, and weld 98 is not present. In embodiments including weld 98, the end of intermediate conduit 90 where outlet connector 92 is joined can be shaped to facilitate welding at the weld 98.

Aspects:

Any of Aspects 1-14 may be combined with any of Aspects 15-20, 21-34, or 35-40. Any of Aspects 15-20 may be combined with any of aspects 21-34 or 35-40. Any of aspects 21-34 may be combined with any of aspects 35-40.

Aspect 1. A purge port assembly for a wafer container, comprising: a purge module configured to allow inlet flow of purge gas; and a transition portion disposed over an intermediate outlet of the purge module, the transition portion including: a receiver having an inlet opening configured to receive the purge gas discharged from the purge module, an outlet connector configured to attach with a diffuser, and an intermediate conduit connecting the receiver to the outlet connector, the intermediate conduit extending from the receiver at an acute angle relative to an axis of the inlet opening of the receiver, and the intermediate conduit having a length that spaces apart the outlet connector from the receiver.

Aspect 2. The purge port assembly of Aspect 1, wherein a minimum inner cross-sectional area of the intermediate conduit is at least 13 mm$^2$.

Aspect 3. The purge port assembly of any one of Aspects 1 and 2, wherein a pressure drop across the intermediate passage is less than 20 kPa at a purge gas flowrate of 100 SLPM.

Aspect 4. The purge port assembly of any one of Aspects 1-3, wherein the acute angle is 15-35 degrees.

Aspect 5. The purge port assembly of any one of Aspects 1-4, wherein the purge module includes a first intermediate outlet, the receiver includes a first intermediate inlet and a second intermediate outlet, the first intermediate outlet of the purge module fluidly connected to the first intermediate inlet of the receiver, and the first intermediate inlet forming the inlet opening of the receiver, and the outlet connector includes a second intermediate inlet, and the intermediate conduit extends from the second intermediate outlet of the receiver to the second intermediate inlet of the outlet conduit.

Aspect 6. The purge port assembly of any one of Aspects 1-5, wherein the receiver includes one or more side walls and an end wall, the end wall and the inlet opening disposed at opposite ends of the receiver, the intermediate conduit extending from one of the one or more side walls of the receiver and the top wall of the receiver.

Aspect 7. The purge port assembly of Aspect 6, wherein an angle between the end wall of the receiver and an inner side of the intermediate conduit is at or about 105-125 degrees.

Aspect 8. The purge port assembly of any one of Aspects 1-7, wherein a ratio of an area of the inlet opening of the receiver to a minimum cross-sectional area of the intermediate conduit is equal to or greater than 23:1

Aspect 9. The purge port assembly of any one of Aspects 1-8, wherein the intermediate conduit has a tubular shape extending from the receiver to the outlet connector.

Aspect 10. The purge port assembly of any one of Aspects 1-9, further comprising: a filter disposed between purge module and the receiver.

Aspect 11. The purge port assembly of any one of Aspects 1-10, further comprising: the diffuser, the diffuser having a column shape with an end fittedly connected to the outlet connector of the transition portion.

Aspect 12. The purge port assembly of any one of Aspects 1-11, wherein the transition portion is formed as a single integral part.

Aspect 13. The purge port assembly of any one of Aspects 1-12, wherein the purge module and the transition portion are configured to be disposed in an opening in a shell of the wafer container, the opening extending through a bottom side of the shell of the wafer container and the purge port assembly configured to block the opening in the shell.

Aspect 14. The purge port assembly of Aspect 13, wherein the transition portion is configured to extend from the opening into an interior space of the wafer container.

Aspect 15. A wafer container, comprising: a shell including an interior space; a purge port assembly extending through an opening in the shell into the interior space, the purge port assembly including: a purge module disposed in the opening in the shell, the purge module including a check valve configured to allow purge gas; and a transition portion disposed over the purge module in the opening in the shell, the transition portion including: a receiver with an inlet opening configured to receive the purge gas discharged from the purge module, an outlet connector configured to attach with a diffuser, and an intermediate conduit connecting the receiver to the outlet connector, the intermediate conduit extending at an acute angle relative to an axis of the inlet opening of the receiver, the intermediate conduit having a length that spaces apart the outlet connector from the receiver.

Aspect 16. The wafer container of Aspect 15, wherein transition portion extends from the opening in the shell into the interior space of the shell.

Aspect 17. The wafer container of Aspect 16, wherein the receiver of the transition portion is disposed in the opening in the shell, the outlet connector of the transition portion is disposed in the interior space of the shell, and the intermediate conduit extends from the opening in the shell into the interior space of the shell.

Aspect 18. The wafer container of any one of Aspects 15-17, wherein the intermediate conduit is configured to extend at an angle of 15-35 degrees relative to an axis of the opening in the shell.

Aspect 19. The wafer container of any one of Aspects 15-18, wherein the wafer container is a front opening unified pod, the shell including a front opening and a door configured to be disposed in the front opening.

Aspect 20. The wafer container of any one of Aspects 15-19, further comprising: the diffuser, the diffuser having a column shape and including an end fittingly connected to the outlet connector.

Aspect 21. A purge port assembly for a wafer container, comprising:
a purge module configured to allow inlet flow of purge gas; and
a transition portion disposed over an intermediate outlet of the purge module, the transition portion including:
a receiver having an inlet opening configured to receive the purge gas discharged from the purge module,
an outlet connector configured to attach with a diffuser, and
an intermediate conduit connecting the receiver to the outlet connector, the intermediate conduit having a tubular shape extending from the receiver to the outlet connector, and the intermediate conduit having a length that spaces apart the outlet connector from the receiver.

Aspect 22. The purge port assembly according to aspect 21, wherein a minimum inner cross-sectional area of the intermediate conduit is at least 13 mm$^2$.

Aspect 23. The purge port assembly according to any of aspects 21-22, wherein a pressure drop across the intermediate passage is less than 20 kPa at a purge gas flowrate of 100 SLPM.

Aspect 24. The purge port assembly according to any of aspects 21-23, wherein the intermediate conduit extends from the receiver at an acute angle relative to an axis of the inlet opening of the receiver.

Aspect 25. The purge port assembly according to aspect 24, wherein the acute angle is 15-degrees.

Aspect 26. The purge port assembly according to any of aspects 21-23, wherein the intermediate conduit includes a curve.

Aspect 27. The purge port assembly according to aspect 26, wherein the curve is continuous along a length of the intermediate conduit.

Aspect 28. The purge port assembly according to any of aspects 21-27, wherein the intermediate conduit extends such that the outlet connector is spaced entirely apart from the receiver when the purge port assembly is viewed in plan view.

Aspect 29. The purge port assembly according to any of aspects 21-28, wherein a portion of intermediate conduit projecting from an upper surface of the receiver has a width that is less than half of a diameter of the body of receiver.

Aspect 30. The purge port assembly according to any of aspects 21-29, wherein a ratio of an area of the inlet opening of the receiver to a minimum cross-sectional area of the intermediate conduit is equal to or greater than 23:1

Aspect 31. The purge port assembly according to any of aspects 21-30, wherein a portion of the intermediate conduit projecting above an upper surface of the receiver is disposed entirely on one side of a center line of the receiver.

Aspect 32. The purge port assembly according to any of aspects 21-31, wherein the transition portion is formed integrally with the outlet connector.

Aspect 33. The purge port assembly according to any of aspects 21-32, wherein the purge module and the transition portion are configured to be disposed in an opening in a shell of the wafer container, the opening extending through a bottom side of the shell of the wafer container and the purge port assembly configured to block the opening in the shell.

Aspect 34. The purge port assembly according to aspect 33, wherein the transition portion is configured to extend from the opening into an interior space of the wafer container.

Aspect 35. A wafer container, comprising:
a shell including an interior space;
a purge port assembly extending through an opening in the shell into the interior space, the purge port assembly including:
a purge module disposed in the opening in the shell, the purge module including a check valve configured to allow purge gas; and
a transition portion disposed over the purge module in the opening in the shell, the transition portion including:
a receiver with an inlet opening configured to receive the purge gas discharged from the purge module,
an outlet connector configured to attach with a diffuser, and
an intermediate conduit connecting the receiver to the outlet connector, the intermediate conduit having a tubular shape extending from the receiver to the outlet connector, the intermediate conduit having a length that spaces apart the outlet connector from the receiver.

Aspect 36. The wafer container according to aspect 35, wherein:
the transition portion extends from the opening in the shell into the interior space of the shell,
the receiver of the transition portion is disposed in the opening in the shell,
the outlet connector of the transition portion is disposed in the interior space of the shell, and
the intermediate conduit extends from the opening in the shell into the interior space of the shell.

Aspect 37. The wafer container according to any of aspects 35-36, wherein the intermediate conduit extends at an acute angle relative to an axis of the inlet opening of the receiver.

Aspect 38. The wafer container according to aspect 35-36, wherein the intermediate conduit includes a curve.

Aspect 39. The wafer container according to any of aspects 35-38, wherein the wafer container is a front opening unified pod, the shell including a front opening and a door configured to be disposed in the front opening.

Aspect 40. The wafer container according to any of aspects 35-39, further comprising:
the diffuser, the diffuser having a column shape and including an end fittingly connected to the outlet connector.

The examples disclosed in this application are to be considered in all respects as illustrative and not limitative. In an embodiment, "connects" and "connecting" as described above may refer to "directly connecting". The scope of the invention is indicated by the appended claims rather than by the foregoing description; and all changes which come within the meaning and range of equivalency of the claims are intended to be embraced therein.

What is claimed is:

1. A purge port assembly for a wafer container, comprising:
a purge module configured to allow inlet flow of purge gas; and
a transition portion disposed over an intermediate outlet of the purge module, the transition portion including:
a receiver having an inlet opening configured to receive the purge gas discharged from the purge module,
an outlet connector configured to attach with a diffuser, and
an intermediate conduit connecting the receiver to the outlet connector, the intermediate conduit having a tubular shape extending from the receiver to the outlet connector, and the intermediate conduit having a length that spaces apart the outlet connector from the receiver,
wherein the intermediate conduit extends from the receiver at an acute angle relative to an axis of the inlet opening of the receiver.

2. The purge port assembly of claim 1, wherein a minimum inner cross-sectional area of the intermediate conduit is at least 13 mm².

3. The purge port assembly of claim 1, wherein a pressure drop across the intermediate conduit is less than 20 kPa at a purge gas flowrate of 100 SLPM.

4. The purge port assembly of claim 1, wherein the acute angle is 15-35 degrees.

5. The purge port assembly of claim 1, wherein the intermediate conduit extends such that the outlet connector is spaced entirely apart from the receiver when the purge port assembly is viewed in plan view.

6. The purge port assembly of claim 1, wherein a portion of intermediate conduit projecting from an upper surface of the receiver has a width that is less than half of a diameter of a body of the receiver.

7. The purge port assembly of claim 1, wherein a ratio of an area of the inlet opening of the receiver to a minimum cross-sectional area of the intermediate conduit is equal to or greater than 23:1.

8. The purge port assembly of claim 1, wherein a portion of the intermediate conduit projecting above an upper surface of the receiver is disposed entirely on one side of a center line of the receiver.

9. The purge port assembly of claim 1, wherein the transition portion is formed integrally with the outlet connector.

10. The purge port assembly of claim 1, wherein the purge module and the transition portion are configured to be disposed in an opening in a shell of the wafer container, the opening extending through a bottom side of the shell of the wafer container and the purge port assembly configured to block the opening in the shell.

11. The purge port assembly of claim 10, wherein the transition portion is configured to extend from the opening into an interior space of the wafer container.

12. A wafer container, comprising:
a shell including an interior space;
a purge port assembly extending through an opening in the shell into the interior space, the purge port assembly including:
a purge module disposed in the opening in the shell, the purge module including a check valve configured to allow purge gas; and
a transition portion disposed over the purge module in the opening in the shell, the transition portion including:
a receiver with an inlet opening configured to receive the purge gas discharged from the purge module,
an outlet connector configured to attach with a diffuser, and
an intermediate conduit connecting the receiver to the outlet connector, the intermediate conduit having a tubular shape extending from the receiver to the outlet connector, the intermediate conduit having a length that spaces apart the outlet connector from the receiver,
wherein the intermediate conduit extends from the receiver at an acute angle relative to an axis of the inlet opening of the receiver.

13. The wafer container of claim 12, wherein:
the transition portion extends from the opening in the shell into the interior space of the shell,
the receiver of the transition portion is disposed in the opening in the shell,
the outlet connector of the transition portion is disposed in the interior space of the shell, and
the intermediate conduit extends from the opening in the shell into the interior space of the shell.

14. The wafer container of claim 12, wherein the intermediate conduit extends at an acute angle relative to an axis of the inlet opening of the receiver.

15. The wafer container of claim 12, wherein the intermediate conduit includes a curve.

16. The wafer container of claim 12, wherein the wafer container is a front opening unified pod, the shell including a front opening and a door configured to be disposed in the front opening.

17. The wafer container of claim 12, further comprising:
the diffuser, the diffuser having a column shape and including an end fittingly connected to the outlet connector.

* * * * *